(12) United States Patent
Schuppener et al.

(10) Patent No.: US 11,552,200 B2
(45) Date of Patent: Jan. 10, 2023

(54) AVALANCHE PHOTODIODE GAIN CONTROL COMPRISING A BIAS CIRCUIT HAVING A SECOND AVALANCHE PHOTODIODE

(71) Applicant: TEXAS INSTRUMENTS INCORPORATED, Dallas, TX (US)

(72) Inventors: Gerd Schuppener, Allen, TX (US);
Miaad Aliroteh, Milpitas, CA (US);
Srinath Ramaswamy, Murphy, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/347,822

(22) Filed: Jun. 15, 2021

(65) Prior Publication Data

US 2022/0037540 A1 Feb. 3, 2022

Related U.S. Application Data

(60) Provisional application No. 63/060,187, filed on Aug. 3, 2020.

(51) Int. Cl.
*H04B 10/69* (2013.01)
*H01L 31/02* (2006.01)
*H01L 31/107* (2006.01)
*H03F 3/08* (2006.01)

(52) U.S. Cl.
CPC ...... *H01L 31/02027* (2013.01); *H01L 31/107* (2013.01); *H03F 3/08* (2013.01); *H04B 10/6911* (2013.01); *H04B 10/6931* (2013.01)

(58) Field of Classification Search
CPC ......... H01L 31/02027; H01L 31/02002; H01L 31/02327; H01L 31/0232; H01L 31/07; H01L 31/109; H01L 31/00; H01L 31/107; H04B 10/6911; H04B 10/691; H04B 10/697; H04B 10/67; G01J 1/44; H03F 3/08
USPC .......................................... 250/214 R, 214.1
See application file for complete search history.

(56) References Cited

U.S. PATENT DOCUMENTS

| 5,578,815 A | 11/1996 | Nakasa et al. |
| 6,654,215 B2 * | 11/2003 | Green ............... H01L 31/02027 |
| | | 257/E31.116 |
| 2015/0034808 A1 | 2/2015 | Yuan et al. |

FOREIGN PATENT DOCUMENTS

WO 2019199796 A1 10/2019

OTHER PUBLICATIONS

Search Report for PCT/IB2021/000575, dated Dec. 9, 2021, 1 page.

* cited by examiner

*Primary Examiner* — Que Tan Le
(74) *Attorney, Agent, or Firm* — Michael A. Davis, Jr.; Frank D. Cimino

(57) ABSTRACT

An avalanche photo-diode (APD) circuit includes a first APD and a bias circuit. The first APD is configured to detect light. The bias circuit is configured to control a gain of the first APD. The bias circuit includes a second APD, a reference voltage source, a bias voltage generation circuit, and a metal layer configured to shield the second APD from the light. The reference voltage source is configured to bias the second APD. The bias voltage generation circuit is configured to generate a bias voltage for biasing the first APD based on dark current output by the second APD.

20 Claims, 6 Drawing Sheets

AVALANCHE PHOTODIODE GAIN CONTROL COMPRISING A BIAS CIRCUIT HAVING A SECOND AVALANCHE PHOTODIODE

CROSS-REFERENCE TO RELATED APPLICATION

This application claims priority to U.S. Provisional Application 63/060,187 filed Aug. 3, 2020, titled "Avalanche Photodiode Gain Control," which is hereby incorporated by reference in its entirety.

BACKGROUND

Photodiodes are semiconductor devices that generate an electrical current when Photodiodes are used as light-detection elements in a variety of applications. A photodiode includes a p-n junction formed in a semiconductor material. A reverse bias is applied to the p-n junction to widen the depletion layer, and an electric field is applied. Electron-hole pairs are generated in the depletion layer by the absorbed light. Under the attraction of the electric field, electrons move to the n-type semiconductor region, while holes move to the p-type semiconductor region, thereby causing a current to flow. Types of photodiodes include PIN photodiodes and avalanche photodiodes.

SUMMARY

In one example, an avalanche photo-diode (APD) circuit includes a first APD, a reference voltage source, and a bias circuit. The first APD includes an anode. The bias circuit includes a bias output, a second APD, and a layer of metal that covers the second APD. The bias output is coupled to the anode of the first APD. The second APD includes a cathode and an anode. The cathode of the second APD is coupled to the bias output. The anode of the second APD is coupled to the reference voltage source.

In another example, an APD circuit includes a first APD and a bias circuit. The first APD is configured to detect light. The bias circuit is configured to control a gain of the first APD. The bias circuit includes a second APD, a reference voltage source, a bias voltage generation circuit, and a metal layer configured to shield the second APD from the light. The reference voltage source is configured to bias the second APD. The bias voltage generation circuit is configured to generate a bias voltage for biasing the first APD based on dark current output by the second APD.

In a further example, a light detection circuit includes an APD array and a bias circuit. The APD array is configured to detect light, and includes a first APD, and a transimpedance amplifier. The transimpedance amplifier is coupled to first APD. The bias circuit is coupled to the APD array, and is configured to control a gain of the first APD. The bias circuit includes a second APD, a reference voltage source, a current multiplier circuit, a bias voltage generation circuit, and a metal layer that is configured to shield the second APD from the light. The reference voltage source is configured to bias the second APD. The current multiplier circuit is coupled to the second APD, and is configured to provide an output current that is a predetermined multiple of the dark current output by the second APD. The bias voltage generation circuit is configured to generate a bias voltage for biasing the first APD based on the output current of the current multiplier circuit.

DETAILED DESCRIPTION

In a photodiode, photocurrent ($I_p$) is proportional to the incident optical power ($P_{in}$). Responsivity is the ratio of photocurrent generated from incident light, to the incident light, and may be expressed as current over power.

$$R = \frac{I_p}{P_{in}}$$

where:
$I_p$ is in units of amperes (A); and
$P_{in}$ is in units of watts (W).

The quantum efficiency of the photodiode may be defined as:

$$\eta = \frac{\text{electron generation rate}}{\text{photon incidence rate}} = \frac{I_p/q}{P_{in}/h\nu}$$

Responsivity may be expressed based on quantum efficiency as:

$$R = \frac{\eta q}{h\nu} \approx \frac{\eta \lambda}{1.24}$$

Figure 1A:
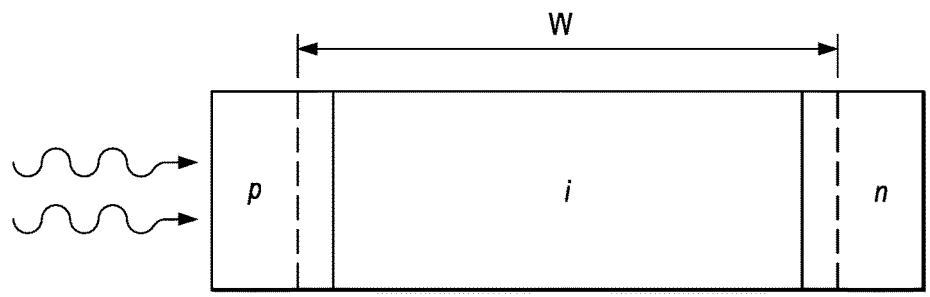
FIG. 1A is a schematic diagram of a positive-intrinsic-negative (PIN) photodiode.
Figure 1B:
FIG. 1B is a graph of the electric field distribution in the reverse biased PIN photodiode of FIG. 1A.

Positive-intrinsic-negative (PIN) photodiodes and avalanche photodiodes (APD) are commonly used to detect light. FIG. 1A is a schematic diagram of a PIN photodiode. FIG. 1B is a graph of the electric field distribution in the reverse biased PIN photodiode. The PIN photodiode includes an intrinsic (or lightly doped) region sandwiched between a p-type region and an n-type region. The intrinsic region increases depletion region width, where photo-generated carriers (electrons and holes) travel by drift, rather than by diffusion as in the p-type and n-type regions. The depletion region creates capacitance that is inversely proportional to the width of the depletion region. Because response time of the photodiode is a function of the capacitance, increasing depletion region width decreases response time. PIN photodiodes are reverse biased well below the breakdown voltage. Table 1 lists various characteristics of typical PIN photodiodes.

TABLE 1

| Parameter | Symbol | Unit | Si | Ge | InGaAs |
|---|---|---|---|---|---|
| Wavelength | λ | μm | 0.4-1.1 | 0.8-1.8 | 1.0-1.7 |
| Responsivity | R | A/W | 0.4-0.6 | 0.5-0.7 | 0.6-0.9 |
| Quantum Efficiency | η | % | 75-90 | 50-55 | 60-70 |
| Dark current | $I_d$ | nA | 1-10 | 50-500 | 1-20 |
| Rise time | $T_r$ | ns | 0.5-1 | 0.1-0.5 | 0.02-0.5 |
| Bandwidth | Δf | GHz | 0.3-0.6 | 0.5-3 | 1-10 |
| Bias Voltage | $V_b$ | V | 10-100 | 6-10 | 3-6 |

Figure 2A:
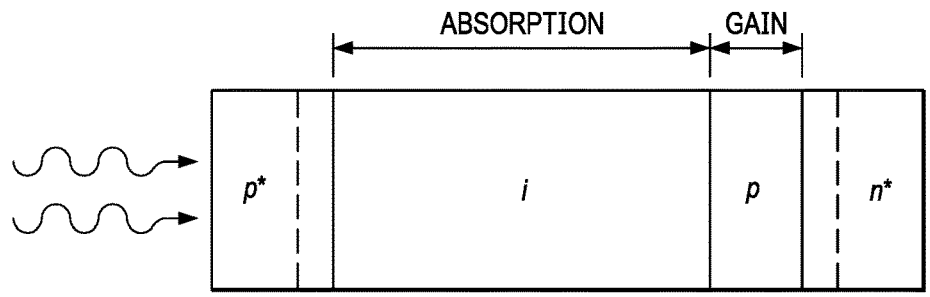
FIG. 2A is a schematic diagram of an avalanche photodiode (APD).
Figure 2B:
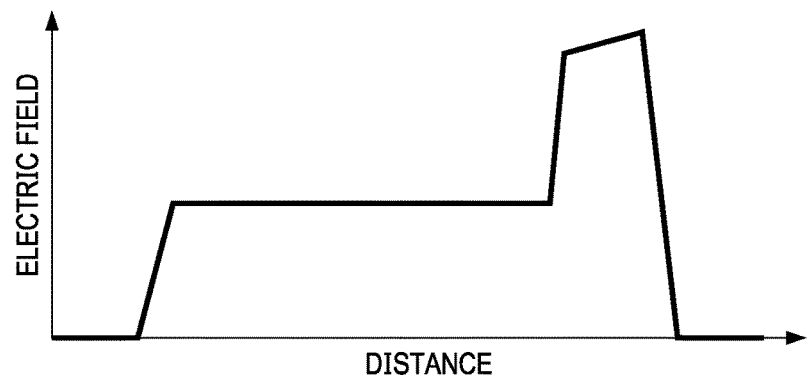
FIG. 2B is a graph of the electric field distribution in the various layers of the reverse biased APD of FIG. 2A.

FIG. 2A is a schematic diagram of an APD. FIG. 2B is a graph of the electric field distribution in the various layers of the reverse biased APD. The APD is similar to the PIN photodiode, and includes an additional p-type region that operates as a multiplication layer. Secondary carriers are generated in the multiplication layer via impact ionization. The responsivity of the APD is expressed as:

$$R_{APD} = MR$$

where:
M is the multiplication factor provided by addition of the multiplication layer; and
R is responsivity of the photodetector without the multiplication layer.
The multiplication factor M may be expressed as:

$$M = \frac{1 - kA}{\exp[-(1-kA)\alpha_e d] - kA}$$

where:
$\alpha_h$ is a hole impact ionization constant;
$\alpha_e$ is an electron impact ionization constant;
d is thickness of the multiplication layer, and $$kA = \frac{\alpha_h}{\alpha_e}$$

The APD is reverse biased at a higher voltage than the PIN photodiode to enable impact ionization (M>>1), With low reverse bias voltage; the APD behaves like a PIN photodiode (M=1). Table 2 lists characteristics of typical APDs.

TABLE 2

| Parameter | Symbol | Unit | Si | Ge | InGaAs |
|---|---|---|---|---|---|
| Wavelength | λ | μm | 0.4-1.1 | 0.8-1.8 | 1.0-1.7 |
| Responsivity | $R_{APD}$ | A/W | 80-130 | 3-30 | 5-20 |
| APD gain | M | | 100-500 | 50-200 | 10-40 |
| k-factor | $k_A$ | | 0.02-0.05 | 0.7-1.0 | 0.5-0.7 |
| Dark current | $I_d$ | nA | 0.1-1 | 50-500 | 1-5 |
| Rise time | $T_r$ | ns | 0.1-2 | 0.5-0.8 | 0.1-0.5 |
| Bandwidth | Δf | GHz | 0.2-.1 | 0.4-0.7 | 1-10 |
| Bias Voltage | $V_b$ | V | 30-300 | 20-40 | 20-30 |

APD gain is dependent on temperature and reverse bias voltage. Gain should be controlled to meet system performance metrics, such as sensitivity, signal-to-noise ratio, linearity, etc. in an array of APDs, the different APDs may receive different incident optical power, and control of the APD gain should be independent of incident light. The effects of ambient or stray light should be compensated.

Figure 3A:
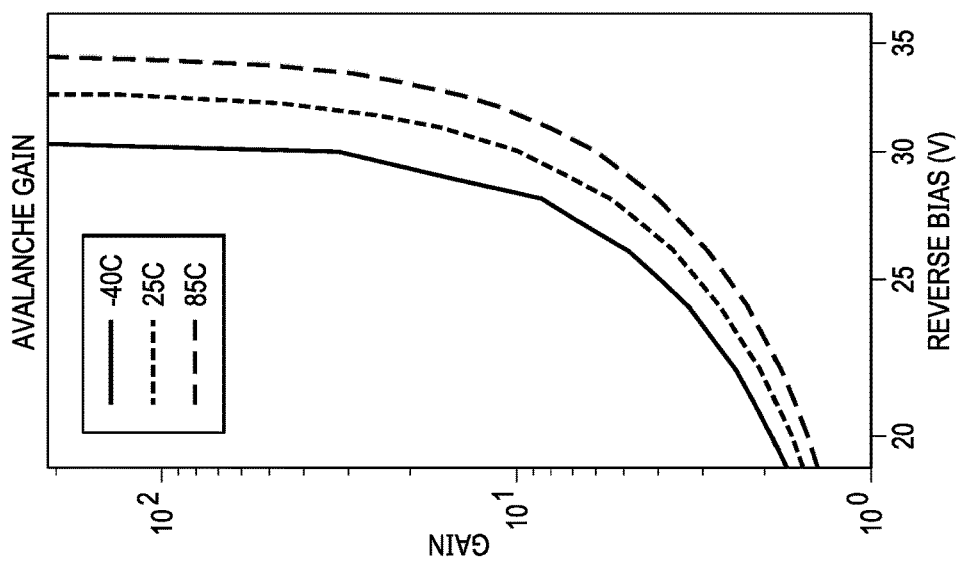
FIG. 3A is a graph of dark current in an APD.
Figure 3B:
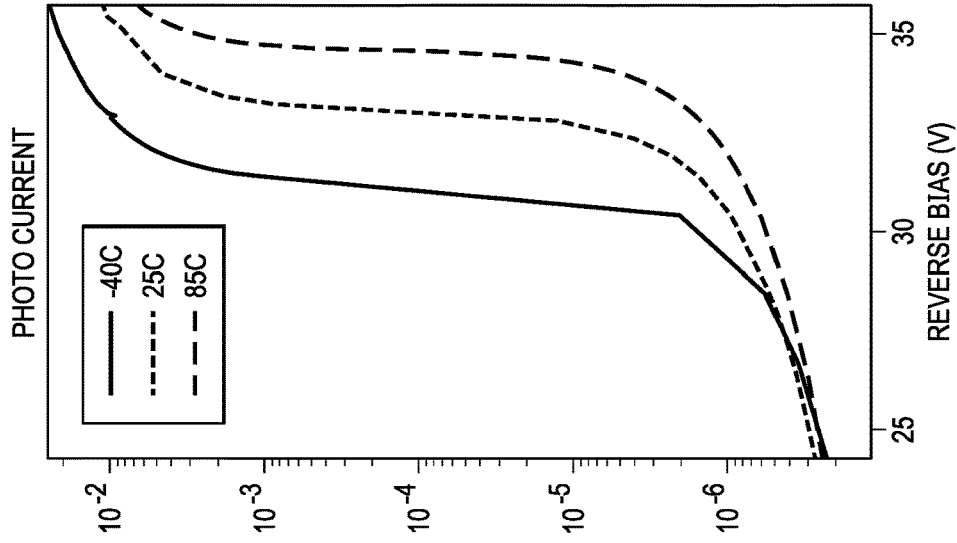
FIG. 3B is a graph of photocurrent in an APD.
Figure 3C:
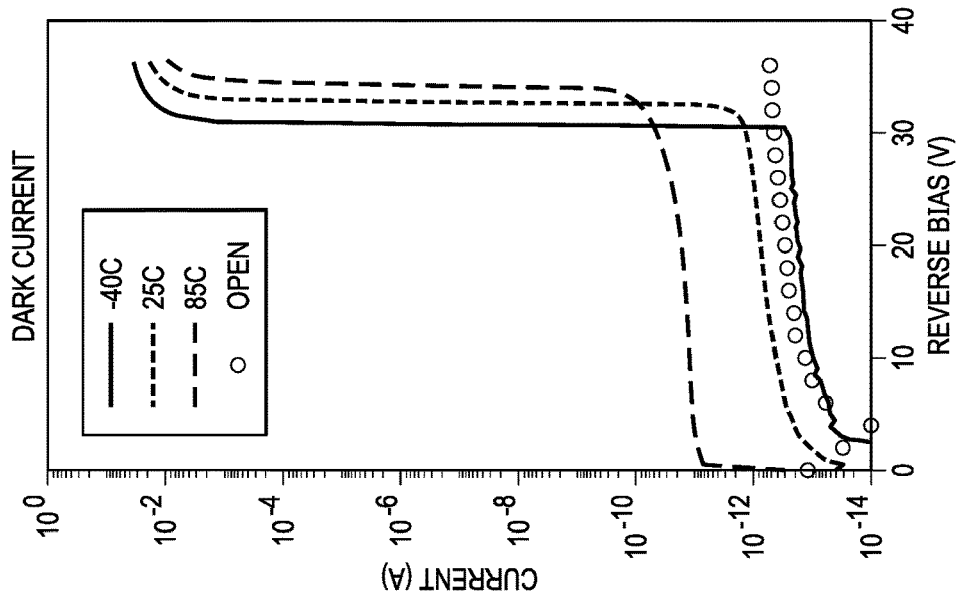
FIG. 3C is a graph of avalanche gain in an APD.

FIGS. 3A, 3B, and 3C are graphs of dark current, photocurrent, and avalanche gain in an APD respectively. Dark current is the small current flowing in an APD when no light is incident on the APD. FIG. 3A shows that for a dark APD avalanche breakdown is dependent on temperature, with higher temperature requiring a higher reverse bias voltage. The slope in the breakdown region is steep. FIG. 3B shows that photocurrent behavior of the APD is similar to the dark current behavior of the APD (e.g., higher temperature requiring higher reverse bias voltage). FIG. 3C shows that for different temperatures the reverse bias voltage must be adjusted to maintain a desired gain. The APD bias control circuits described herein take advantage of this similarity in dark current and photocurrent behavior, and apply dark current to bias the APD and control the gain thereof.

Figure 4:
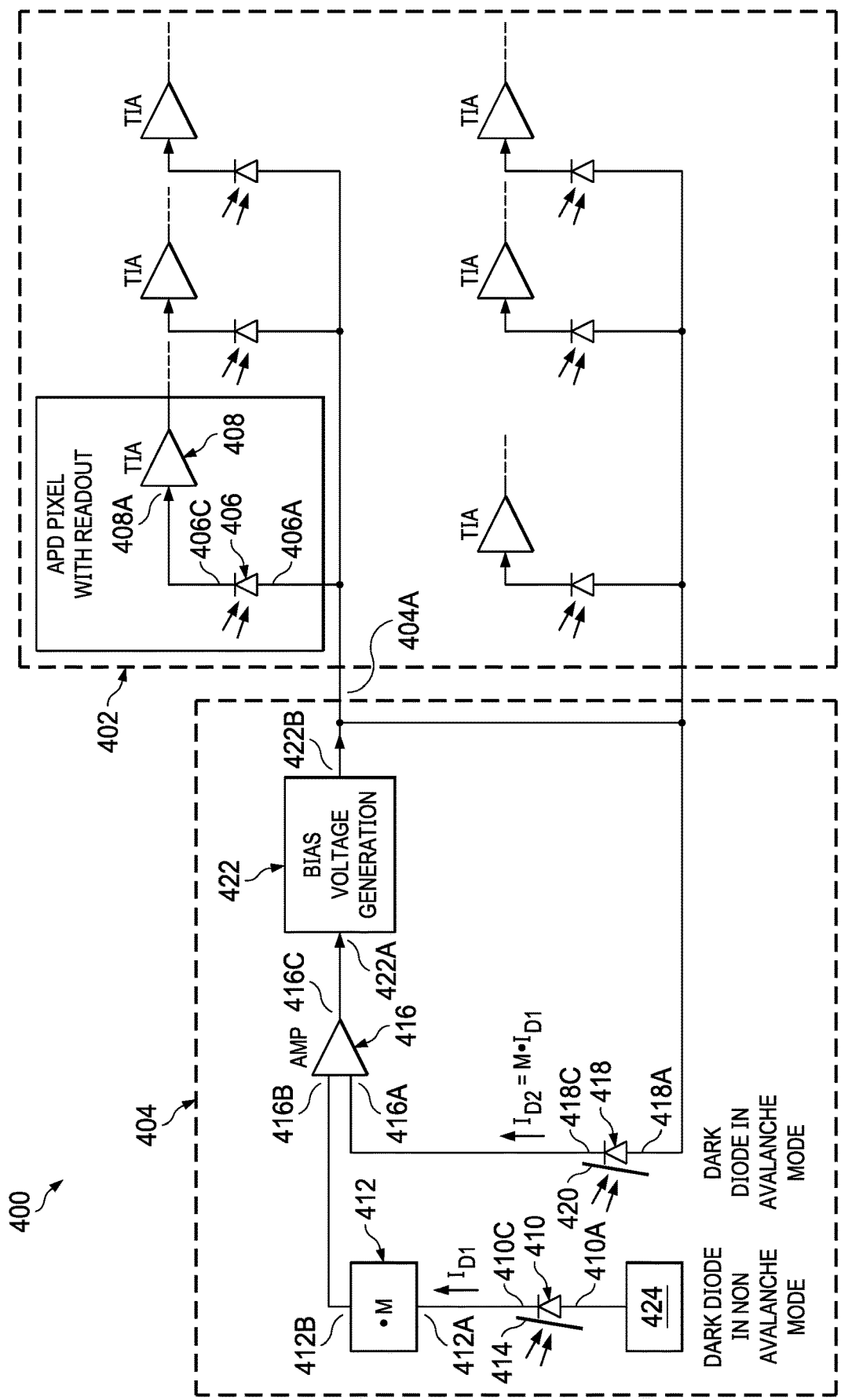
FIG. 4 is a block diagram of an example APD circuit that uses dark current to bias an APD.

FIG. 4 is a block diagram of an APD circuit 400 that uses dark current to bias an APD. The APD circuit 400 may be a light detection circuit, a light detection and ranging (LIDAR) receiver circuit, or other optical transduction circuit. The APD circuit 400 includes an APD array 402 and a bias circuit 404. The APD array 402 may include one or more APDs. Some implementations of the APD array 402 may include hundreds or thousands of APDs. The APD array 402 includes an APD 406 and a transimpedance amplifier (TIA) 408. The APD 406 and the TIA 408 are coupled to form pixel circuitry of the APD array 402. The APD 406, and other APDs of the APD array 402, may be fabricated in silicon, germanium, silicon-germanium, or other semiconductor materials. The APD 406 is exposed to and detects incident light, and produces a photocurrent that is proportional to the incident light. The TIA 408 converts the photocurrent to voltage. An input 408A of the TIA 408 is coupled to the cathode 406C of the APD 406. The anode 406A of the APD 406 is coupled to the bias circuit 404 for receipt of a bias voltage that controls the gain of the APD 406. In practice, the anode of each APD of the APD array 402 is coupled to the bias circuit 404 for receipt of the bias voltage.

The bias circuit 404 generates the bias voltage based on dark current, and is therefore insensitive to ambient light and differences in optical power across the APD array 402. The bias circuit 404 includes a bias output 404A, an APD 410, a current multiplier circuit 412, an amplifier 416, an APD 418, a bias voltage generation circuit 422, and a reference voltage source 424. The bias output 404A is coupled to the anode 406A of the APD 406. The APD 410 and the APD 418 may be instances of the APD 406. The APD 410 and the APD 418 may be located near the APD array 402 (on an integrated circuit) for process and temperature tracking. A layer of metal 414 (or other opaque material) covers the APD 410, and a layer of metal 420 (or other opaque material) covers the APD 418. For example, the metal 414 and the metal 420 may be same metal layer of an integrated circuit that isolates the APD 410 and APD 418 from light. Thus, the APD 410 and the APD 418 generate dark current and do not generate photocurrent.

An anode 410A of the APD 410 is coupled to the reference voltage source 424. The reference voltage source 424 provides a bias voltage that biases the APD 410 for non-avalanche operation. The bias voltage applied to the APD 410 may relatively low (e.g., 0 to −20 volts). The dark current ($I_{D1}$) generated by the APD 410 is multiplied by a predetermined multiplier value in the current multiplier circuit 412. The predetermined multiplier value is determined based on the desired gain of the APD 406. For example, the predetermined multiplier value may be in a range of 10-500. A cathode 410C of the APD 410 is coupled to an input 412A of the current multiplier circuit 412. The current multiplier circuit 412 may be implemented as a current mirror circuit to provide the desired multiplication of the dark current received from the current multiplier circuit 412. The multiplied dark current (MIDI) produced by the current multiplier circuit 412 is provided to the amplifier 416. An input 416B of the amplifier 416 is coupled to the output 412B of the current multiplier circuit 412.

The anode 418A of the APD 418 is coupled to the bias output 404A. Thus, the same bias voltage is applied to the APD 418 and the APD 406, to bias the APD 418 and the APD 406 for avalanche mode operation. The dark current (102) generated by the APD 418 is provided to the amplifier 416. A cathode 418C of the APD 418 is coupled to the input 416A of the amplifier 416.

The amplifier 416 compares the dark currents generated by the APD 410 and the APD 418 to produce a difference voltage (the difference of the two currents (MIDI and $I_{D2}$). The difference voltage output by the amplifier 416 is provided to the bias voltage generation circuit 422.

The bias voltage generation circuit 422 applies the difference voltage received from the amplifier 416 to generate the bias voltage applied to the APD 406 and the APD 418. An input 422A of the bias voltage generation circuit 422 is coupled to an output 416C of the amplifier 416. The bias voltage generated by the bias voltage generation circuit 422 biases the APD 418 to produce dark current 102, where $I_{D2}=MI_{D1}$. If $I_{D2}<MI_{D1}$, the APD reverse bias is increased. If $I_{D2}>MI_{D1}$, the APD reverse bias is decreased. If $I_{D2}=MI_{D1}$, the APD reverse bias is not changed. Thus, the bias voltage applied to the APD 406, and other APDs of the APD array 402, is based on the dark current output by the APD 410 and the APD 418 as function of temperature and process.

Figure 5:
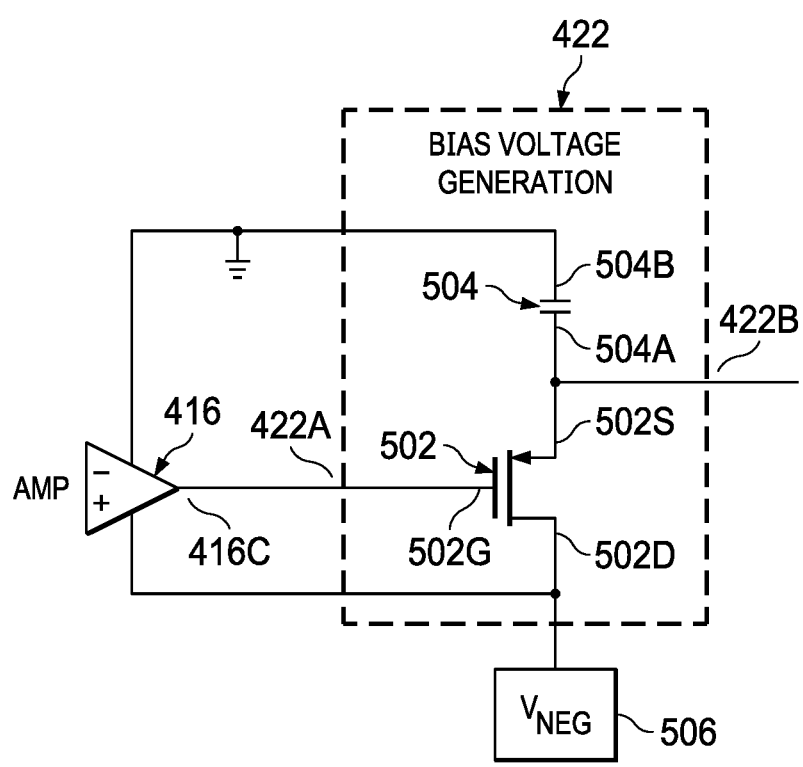
FIG. 5 is a schematic diagram for an example bias voltage generation circuit suitable for use in the APD circuit of FIG. 4.

FIG. 5 is a schematic diagram for an example bias voltage generation circuit 422. The amplifier 416 is also shown in FIG. 5 for reference. The bias voltage generation circuit 422 includes a transistor 502 and a capacitor 504. The transistor 502 may be a p-type field effect transistor (FET). A gate 502G of the transistor 502 is coupled to the input 422A of the bias voltage generation circuit 422 and the output 416C of the amplifier 416. A drain 502D of the transistor 502 is coupled to a negative voltage source 506. The negative voltage source 506 may provide voltage in a range of −20 to −250 volts for biasing the APD array 402. A source 502S of the transistor 502 is coupled to the output 422B and to terminal 504A of the capacitor 504. A terminal 504B of the capacitor 504 is coupled to ground. The difference voltage received at the gate 502G of the transistor 502 controls the transistor 502, and the bias voltage generated at the source 502S of the transistor 502.

Figure 6:
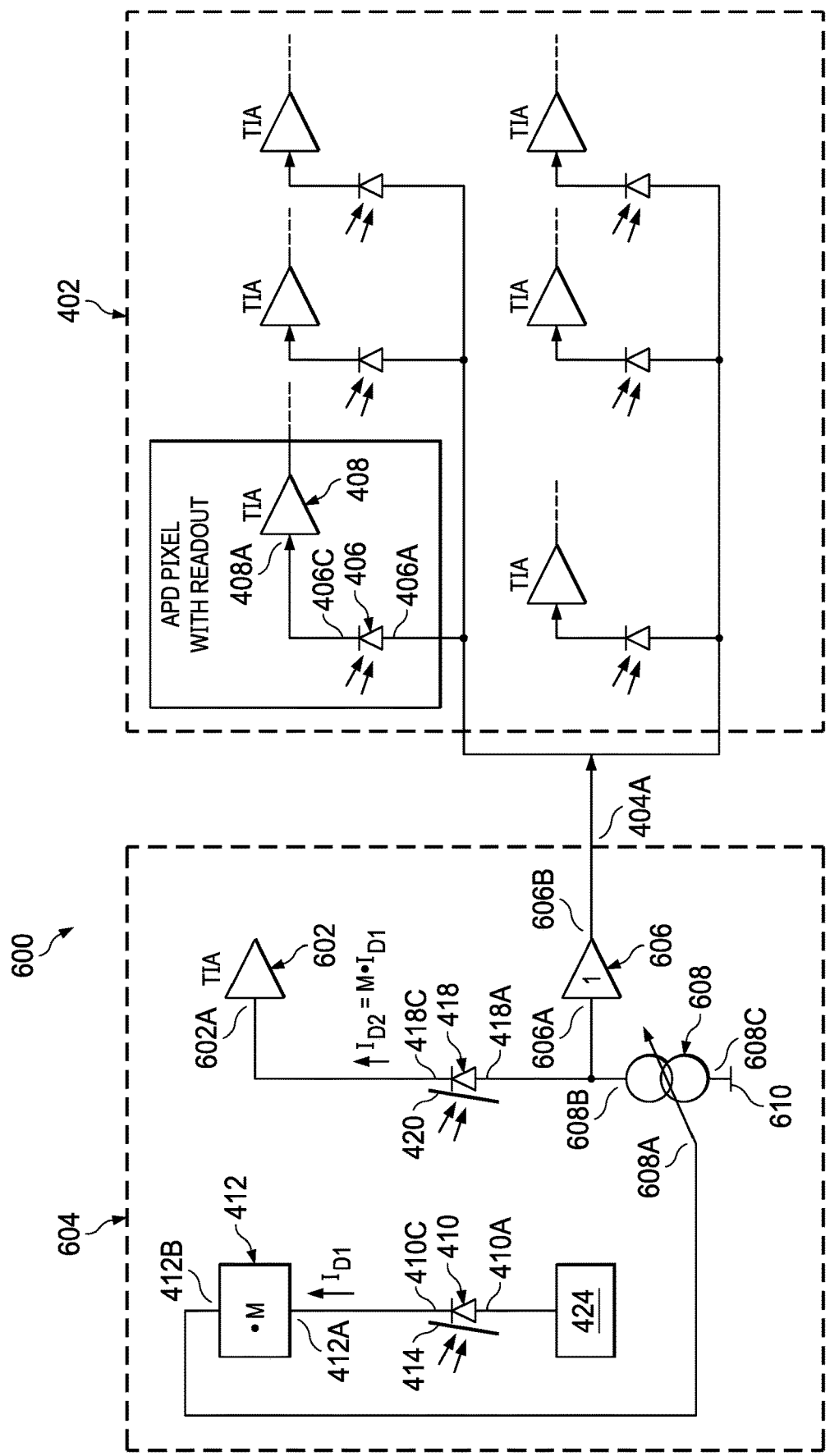
FIG. 6 is a block diagram of an example second APD circuit that uses dark current to bias an APD.

FIG. 6 is a block diagram of a second APD circuit 600 that uses dark current to bias an APD. The APD circuit 600 may be a light detection circuit, a light detection and ranging (LIDAR) receiver circuit, or other optical transduction circuit. The APD circuit 600 includes the APD array 402 and a bias circuit 604. The bias circuit 604 includes the bias output 404A, the APD 410, the current multiplier circuit 412, the APD 418, a transimpedance amplifier 602, a unity gain buffer 606 (a buffer circuit), and a variable current source 608. As explained with regard to the bias circuit 404, the metal 414 and the metal 420 prevent light from reaching the APD 410 and the APD 418.

The APD 410 is biased at a low reverse bias by the reference voltage source 424. The dark current generated by the APD 410 is multiplied by M in the current multiplier circuit 412. The multiplied dark current is provided to the variable current source 608.

In the APD circuit 600, the transimpedance amplifier 602, the unity gain buffer 606, the variable current source 608, and the APD 418 are part of a bias voltage generation circuit. A control input 608A of the variable current source 608 is coupled to the output 412B of the current multiplier circuit 412. The multiplied dark current received at the variable current source 608 controls the current output by the variable current source 608. An input 608C of the variable current source 608 is coupled to a negative voltage source 610. Current MIDI output by the variable current source 608 is forced into the APD 418 to generate the bias voltage for the APD 406. An output 608B of the variable current source 608 is coupled to the anode 418A of the APD 418 and the input 606A of the unity gain buffer 606. The cathode 418C of the APD 418 is coupled to an input 602A of the transimpedance amplifier 602 to provide the same cathode voltage as the APD 406.

The unity gain buffer 606 buffers the voltage at the anode 418A of the APD 418. An output 606B of the unity gain buffer 606 is coupled to the bias output 404A to provide bias voltage to the APD 406, and other APDs of the APD array 402.

Figure 7:
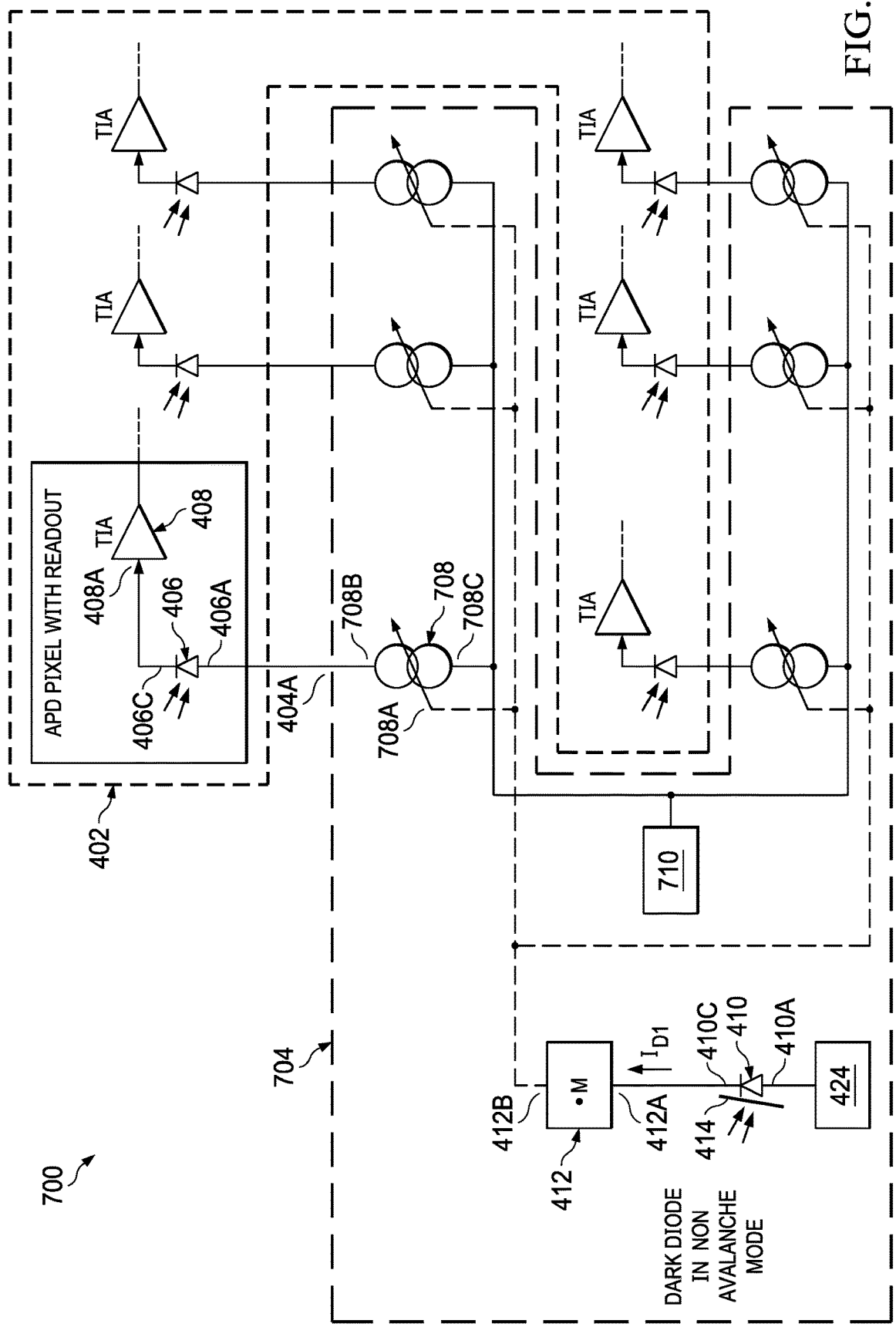
FIG. 7 is a block diagram of an example third APD circuit that uses dark current to bias an APD.

FIG. 7 is a block diagram of a third APD circuit 700 that uses dark current to bias an APD. The APD circuit 700 may be a light detection circuit, a light detection and ranging (LIDAR) receiver circuit, or other optical transduction circuit. The APD circuit 700 includes the APD array 402 and a bias circuit 704. The bias circuit 704 includes the bias output 404A, the APD 410, the current multiplier circuit 412, and a variable current source 708. As explained with regard to the bias circuit 404, the metal 414 prevent lights from reaching the APD 410.

The APD 410 is biased at a low reverse bias by the reference voltage source 424. The dark current generated by the APD 410 is multiplied by M in the current multiplier circuit 412. The multiplied dark current is provided to the variable current source 708.

In the APD circuit 700, the variable current source 702 is part of a bias voltage generation circuit. A control input 708A of the variable current source 708 is coupled to the output 412б of the current multiplier circuit 412. The multiplied dark current received at the variable current source 708 controls the current at output 708B of the variable current source 708. An input 708C of the variable current source 708 is coupled to a negative voltage source 710. Current MIDI output by the variable current source 708 is forced into the APD 406 to generate the desired bias voltage. An instance of the variable current source 708 is coupled to each APD of the APD array 402 with a control input coupled to the output 412B of the current multiplier circuit 412 and an input coupled to the negative voltage source 710.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Modifications are possible in the described embodiments, and other embodiments are possible, within the scope of the claims.

What is claimed is:

1. An avalanche photodiode (APD) circuit, comprising:
   a first APD including an anode; and
   a bias circuit including:
      a bias output coupled to the anode of the first APD;
      a second APD including:
         a cathode; and
         an anode coupled to a reference voltage source terminal;
      a layer of metal covering the second APD; and
      control circuitry coupled between the bias output and the cathode of the second APD.

2. The APD circuit of claim 1, wherein the control circuitry includes:
   a current multiplier circuit including:
      an input coupled to the cathode of the second APD; and
      an output.

3. The APD circuit of claim 2, wherein the control circuitry includes:
   a variable current source including:
      a control input coupled to the output of the current multiplier circuit; and
      an output.

4. The APD circuit of claim 3, wherein:
   the bias circuit includes:
      a third APD including:
         an anode coupled to the output of the variable current source; and
      the layer of metal covers the third APD.

5. The APD circuit of claim 3, wherein the control circuitry includes a buffer circuit coupled between the bias output and the output of the variable current source.

6. The APD circuit of claim 2, wherein:
   the bias circuit includes:
      a third APD including:
         an anode coupled to the bias output; and
      the layer of metal covers the third APD.

7. The APD circuit of claim 6, wherein:
   the third APD includes a cathode; and
   the control circuitry includes:
      an amplifier including:
         a first input coupled to the output of the current multiplier circuit;
         a second input coupled to the cathode of the third APD; and
         an output.

8. The APD circuit of claim 7, wherein the bias circuit further includes:
   a bias voltage generation circuit including:
      an input coupled to the output of the amplifier; and
      an output coupled to the bias output.

9. An avalanche photodiode (APD) circuit, comprising:
   a first APD having a gain control input;
   a bias circuit including:
      a second APD having a bias input and a current output, the second APD configured to provide a dark current at the current output responsive to a voltage at the bias input;
      a metal layer configured to shield the second APD; and
      control circuitry coupled between the current output and the gain control input, the control circuitry configured to provide a bias voltage at the gain control input responsive to the dark current from the current output.

10. The APD circuit of claim 9, wherein the control circuitry includes:
    a current multiplier circuit coupled between the current output and the gain control input, the current multiplier circuit configured to provide a current that is a multiple of the dark current from the current output.

11. The APD circuit of claim 10, wherein:
    the gain control input is an anode of the first APD; and
    the control circuitry includes:
       a variable current source coupled between the current multiplier circuit and the anode of the first APD, the variable current source configured to provide a bias current responsive to the current from the current multiplier circuit.

12. The APD circuit of claim 11, wherein:
    the bias circuit includes:
       a third APD including:
          an anode coupled to a bias current output of the variable current source; and
       the metal layer is configured to shield the third APD.

13. The APD circuit of claim 11, wherein the control circuitry includes:
    a buffer circuit coupled between the variable current source and the anode of the first APD, the buffer circuit configured to provide the bias voltage at the anode of the first APD responsive to the bias current from the variable current source.

14. The APD circuit of claim 10, wherein:
    the control circuitry includes an amplifier having an amplifier output and first and second amplifier inputs, and the amplifier is configured to provide a difference voltage at the amplifier output responsive to a difference between: a current to the first amplifier input; and a current to the second amplifier input;
    the control circuitry includes a bias voltage generation circuit coupled between the amplifier output and the gain control input;
    the current multiplier circuit is coupled between the current output and the first amplifier input;
    the bias circuit includes a third APD coupled between the gain control input and the second amplifier input; and
    the metal layer is configured to shield the third APD.

15. The APD circuit of claim 14, wherein the control circuitry is configured to provide the bias voltage at the gain control input responsive to the difference voltage at the amplifier output.

16. A light detection circuit, comprising:
    an avalanche photodiode (APD) array including:
       a first APD having a gain control input and an APD output; and
       a transimpedance amplifier coupled to the APD output; and
    a bias circuit including:
       a second APD having a bias input and a current output, the second APD configured to provide a dark current at the current output responsive to a voltage at the bias input;
       a metal layer configured to shield the second APD;
       control circuitry coupled between the current output and the gain control input, the control circuitry including:
       a current multiplier circuit having a multiplier input and a multiplier output, the multiplier input coupled to the current output, and the current multiplier circuit configured to provide a current at the multiplier output that is a multiple of the dark current from the current output;

the control circuitry configured to provide a bias voltage at the gain control input responsive to the current from the multiplier output.

17. The light detection circuit of claim 16, wherein:
the gain control input is an anode of the first APD; and
the control circuitry includes:
   a variable current source coupled between the multiplier output and the anode of the first APD, the variable current source configured to provide a bias current responsive to the current from the multiplier output.

18. The light detection circuit of claim 17, wherein:
the transimpedance amplifier is a first transimpedance amplifier;
the bias circuit includes:
   a third APD including:
      an anode coupled to a bias current output of the variable current source; and
      a cathode; and
   a second transimpedance amplifier coupled to the cathode of the third APD;
the control circuitry includes a buffer circuit coupled between the bias current output of the variable current source and the anode of the first APD, the buffer circuit configured to provide the bias voltage at the anode of the first APD responsive to the bias current from the variable current source; and
the metal layer is configured to shield the third APD.

19. The light detection circuit of claim 16, wherein:
the control circuitry includes an amplifier having an amplifier output and first and second amplifier inputs, and the amplifier is configured to provide a difference voltage at the amplifier output responsive to a difference between: a current to the first amplifier input; and a current to the second amplifier input;
the control circuitry includes a bias voltage generation circuit coupled between the amplifier output and the gain control input;
the multiplier output is coupled to the first amplifier input;
the bias circuit includes a third APD coupled between the gain control input and the second amplifier input; and
the metal layer is configured to shield the third APD.

20. The light detection circuit of claim 19, wherein the control circuitry is configured to provide the bias voltage at the gain control input responsive to the difference voltage at the amplifier output.

* * * * *